United States Patent
Watanabe et al.

(10) Patent No.: US 8,980,003 B2
(45) Date of Patent: Mar. 17, 2015

(54) METHOD OF MANUFACTURING SILICON CARBIDE SINGLE CRYSTAL

(75) Inventors: Hiroki Watanabe, Obu (JP); Yasuo Kitou, Okazaki (JP); Masami Naito, Inazawa (JP)

(73) Assignee: DENSO CORPORATION, Kariya (JP)

( * ) Notice: Subject to any disclaimer, the term of this patent is extended or adjusted under 35 U.S.C. 154(b) by 1317 days.

(21) Appl. No.: 12/702,535

(22) Filed: Feb. 9, 2010

(65) Prior Publication Data
US 2010/0199910 A1 Aug. 12, 2010

(30) Foreign Application Priority Data

Feb. 12, 2009 (JP) .................................. 2009-29584

(51) Int. Cl.
C30B 25/18 (2006.01)
C30B 25/20 (2006.01)
C30B 23/00 (2006.01)
C30B 23/02 (2006.01)
C30B 29/36 (2006.01)

(52) U.S. Cl.
CPC ................ C30B 25/20 (2013.01); C30B 23/00 (2013.01); C30B 23/025 (2013.01); C30B 29/36 (2013.01); Y10S 117/902 (2013.01)
USPC ................. 117/101; 117/84; 117/88; 117/90; 117/94; 117/95; 117/902; 117/951

(58) Field of Classification Search
USPC ............ 117/84, 88, 90, 94, 95, 101, 902, 951
See application file for complete search history.

(56) References Cited

U.S. PATENT DOCUMENTS

| 5,958,132 | A * | 9/1999 | Takahashi et al. ............... 117/84 |
| 6,890,600 | B2 | 5/2005 | Nakamura et al. |
| 2003/0070611 | A1* | 4/2003 | Nakamura et al. ............ 117/109 |
| 2003/0107047 | A1* | 6/2003 | Okuyama et al. ................ 257/95 |
| 2004/0194693 | A1* | 10/2004 | Naito et al. ...................... 117/84 |
| 2007/0221119 | A1 | 9/2007 | Kimoto et al. |
| 2007/0224784 | A1* | 9/2007 | Soloviev et al. .............. 438/478 |
| 2007/0281173 | A1* | 12/2007 | Kojima et al. ................. 428/446 |

FOREIGN PATENT DOCUMENTS

| JP | 2003115460 A * | 4/2003 |
| JP | A-2005-350278 | 12/2005 |
| JP | 2009-029825 | 2/2009 |

OTHER PUBLICATIONS

Patent Abstracts of Japan, English Abstract and computer translation of JP 2003-115460 (2013).*
U.S. Appl. No. 12/656,210, filed Jan. 21, 2010, Kitou et al.

* cited by examiner

*Primary Examiner* — Matthew Song
(74) *Attorney, Agent, or Firm* — Posz Law Group, PLC

(57) ABSTRACT

In a method of manufacturing a silicon carbide single crystal, a silicon carbide substrate having a surface of one of a (11-2n) plane and a (1-10n) plane, where n is any integer number greater than or equal to 0, is prepared. An epitaxial layer having a predetermined impurity concentration is grown on the one of the (11-2n) plane and the (1-10n) plane of the silicon carbide substrate by a chemical vapor deposition method so that a threading dislocation is discharged from a side surface of the epitaxial layer. A silicon carbide single crystal is grown into a bulk shape by a sublimation method on the one of the (11-2n) plane and the (1-10n) plane of the epitaxial layer from which the threading dislocation is discharged.

16 Claims, 8 Drawing Sheets

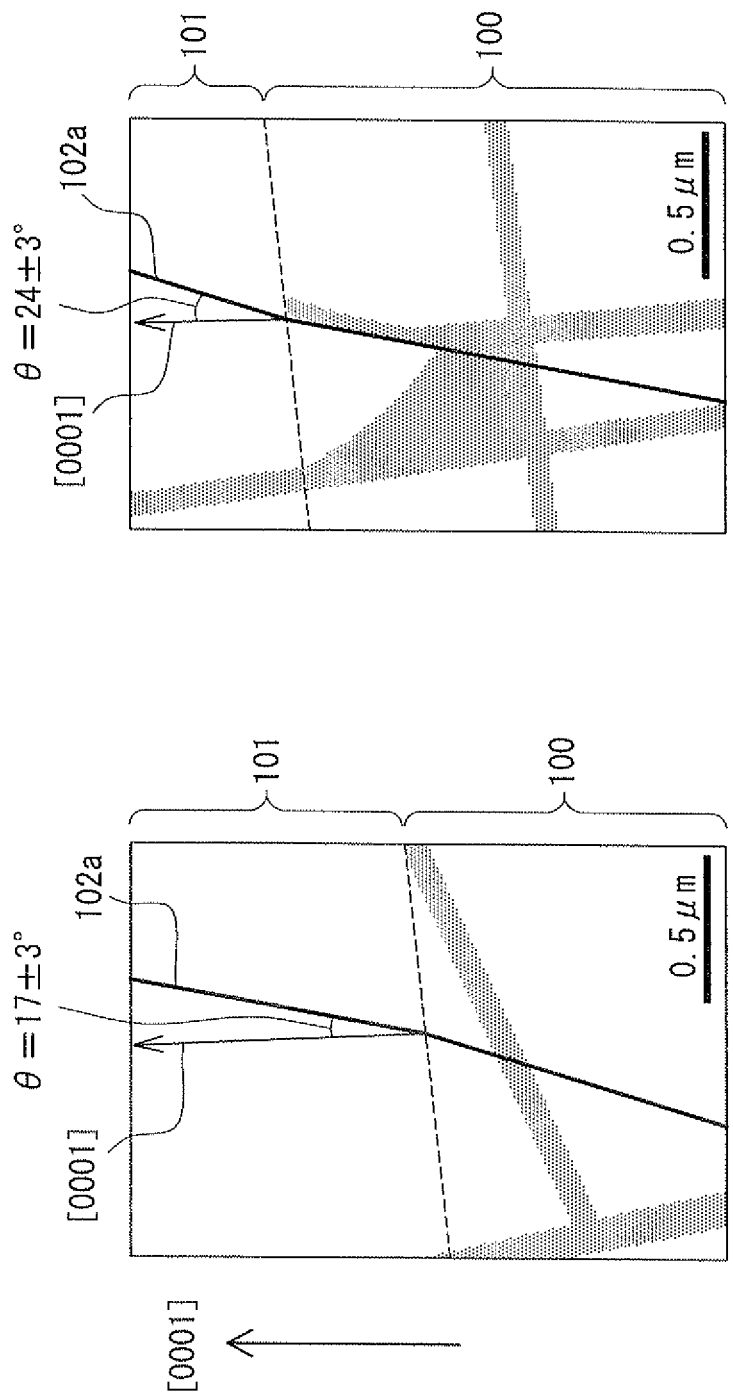

METHOD OF MANUFACTURING SILICON CARBIDE SINGLE CRYSTAL

CROSS REFERENCE TO RELATED APPLICATIONS

The present application is based on and claims priority to Japanese Patent Application No. 2009-29584 filed on Feb. 12, 2009, the contents of which are incorporated in their entirety herein by reference.

BACKGROUND OF THE INVENTION

1. Field of the Invention

The present invention relates to a method of manufacturing a silicon carbide (SiC) single crystal.

2. Description of the Related Art

Conventionally, an SiC is expected to be used for a device having a high breakdown voltage. In the SiC, a crystal defect such as a dislocation and a stacking fault may generate during a crystal growth. In order to reduce the crystal defect, various methods are disclosed.

For example, in a method disclosed in U.S. 2007/0221119 A (corresponding to JP-A-2005-324994), an SiC single crystal is epitaxially grown on a surface of 4H-SiC that inclines from a (0001) plane toward a <11-20> axial direction at an off-angle greater than or equal to 12 degrees and less than 30 degrees so that a crystal defect and an impurity concentration of the SiC single crystal is reduced.

However, even when the SiC single crystal is epitaxially grown on the surface of 4H-SiC that inclines from the (0001) plane toward the <11-20> axial direction at the off-angle greater than or equal to 12 degrees and less than 30 degrees, it is difficult to restrict an inheritance of a dislocation.

In a method disclosed in U.S. Pat. No. 6,890,600 (corresponding to JP-A-2003-119097), an SiC single crystal is grown on a (1-100) plane and a (11-20) plane in order, and finally, the SiC single crystal is grown on a (0001) plane so that a crystal defect of the SiC single crystal is reduced.

Even when the SiC single crystal is grown using various planes, a stacking fault that generates during an A-plane growth may change into a threading dislocation during a C-plane growth and a defect may be inherited. The threading dislocation includes a threading spiral growth and a threading edge dislocation.

JP-A-2005-350278 discloses a method in which grooves are provided on a surface of an SiC single crystal and the SiC single crystal is grown on side surfaces of the grooves in a horizontal direction so that a crystal defect is restricted from growing in a <0001> direction and the crystal defect is reduced.

Even when the SiC single crystal is grown on the side surfaces of the grooves in the horizontal direction, a direction of a dislocation is not always parallel to a growth direction. Therefore, it is difficult to restrict a dislocation in the <0001> direction completely.

Thus, the above-described methods are difficult to restrict an inheritance of a crystal defect in a growth direction of the SiC single crystal during a crystal growth and are difficult to restrict the crystal defect sufficiently.

SUMMARY OF THE INVENTION

In view of the foregoing problems, it is an object of the present invention to provide a method of manufacturing a silicon carbide single crystal that can restrict a crystal defect.

In a method of manufacturing a silicon carbide single crystal according to an aspect of the present invention, a silicon carbide substrate having a surface of one of a (11-2n) plane and a (1-10n) plane, where n is any integer number greater than or equal to 0, is prepared. An epitaxial layer having a predetermined impurity concentration is grown on the one of the (11-2n) plane and the (1-10n) plane of the silicon carbide substrate by a chemical vapor deposition method so that a threading dislocation is discharged from a side surface of the epitaxial layer. A silicon carbide single crystal is grown into a bulk shape by a sublimation method on the one of the (11-2n) plane and the (1-10n) plane of the epitaxial layer from which the threading dislocation is discharged.

The above-described method can restrict a crystal defect in the silicon carbide single crystal.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 14C is a diagram illustrating the cross-sectional view shown in FIG. 14A; and FIG. 14D is a diagram illustrating the cross-sectional view shown in FIG. 14B.

DETAILED DESCRIPTION OF THE EXEMPLARY EMBODIMENTS

First, the process by which the inventors arrived at the present invention will be described below. The inventors studied a growth direction of an SiC single crystal and a growth direction of a crystal defect, and found that a threading dislocation is inherited in various directions with respect to a growth direction of an SiC single crystal when the SiC single crystal is formed by a sublimation method using a C-plane off-substrate and a growth direction of an inherited threading dislocation is limited to a (11-2n) plane or a (1-10n) plane when an SiC single crystal is formed by an epitaxial growth by a chemical vapor deposition (CVD) method using a C-plane off-substrate, where "n" is any integer number. Furthermore, the inventors found that there is a relationship between the growth direction of the threading dislocation and an impurity concentration during the epitaxial growth. The (11-2n) plane includes, for example, a (11-21) plane, a (11-22) plane, and a (11-23) plane. The (1-10n) plane includes, for example, a (1-101) plane, a (1-102) plane, and a (1-103) plane.

The inventors studied a relationship between an impurity concentration and a threading dislocation when an SiC single crystal is epitaxially grown in a direction inclining from a C-plane. Specifically, the inventors studied directivity of various threading dislocations when an SiC single crystal is epitaxially grown on an off-substrate while introducing nitrogen as an N type impurity on the off-substrate. The off-substrate inclines from the C-plane at a predetermine off-angle. A result of the study by the inventors is shown in FIG. 13 A.

Figure 13A:
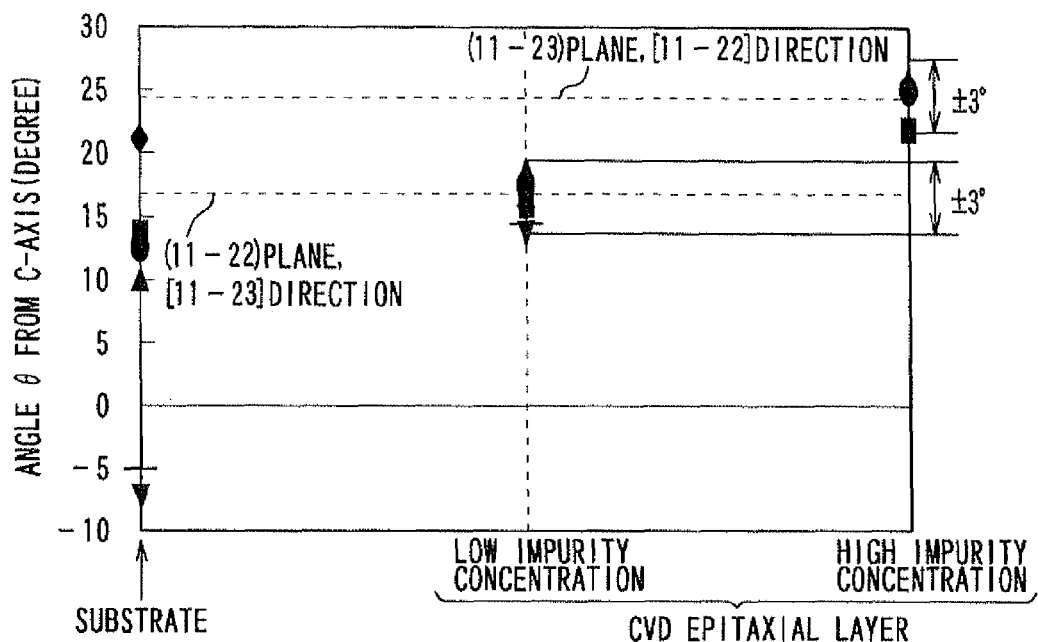
FIG. 13A is a graph showing examples of relationships between impurity concentrations of an epitaxial layer and growth directions of threading dislocations when the epitaxial layer is grown at a predetermined off-angle with respect to a C-plane.
Figure 13B:
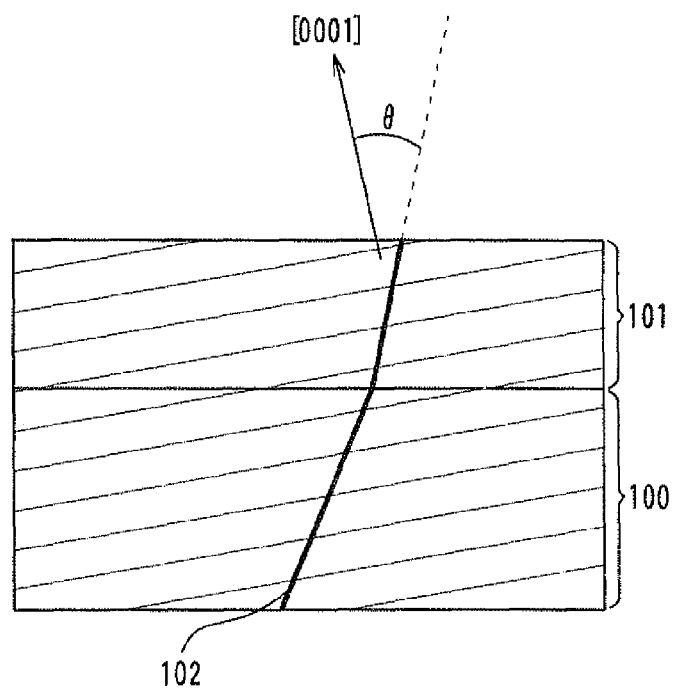
FIG. 13B is a diagram for explaining an angle θ of a threading dislocation with respect to a C-axis.
Figure 14A:
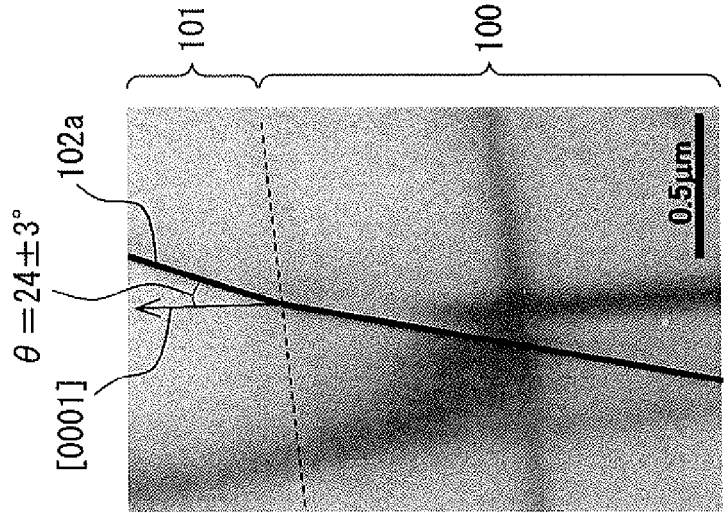
FIG. 14A is a diagram showing a cross-sectional view of an experimental result of growing an epitaxial layer having an impurity concentration of about $1 \times 10^{16}$ cm$^{-3}$ on an off-substrate.
Figure 14B:
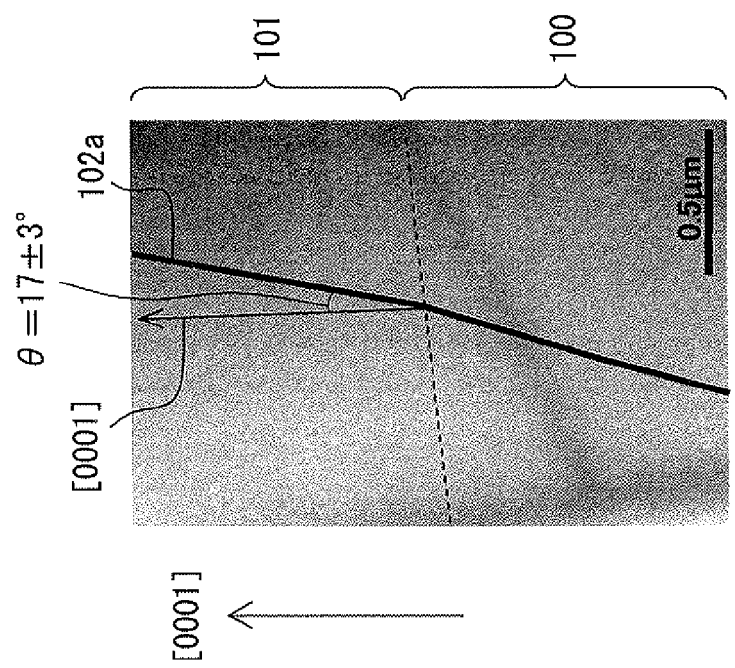
FIG. 14B is a diagram showing a cross-sectional view of an experimental result of growing an epitaxial layer having an impurity concentration of about $1 \times 10^{18}$ cm$^{-3}$ on an off-substrate.

The directivity of each of the threading dislocations with respect to an C-axis is expressed as an angle θ. Specifically, as shown in FIG. 13B, the angle θ is defined by setting a [0001] direction as a reference and setting a normal direction of a surface of the off-substrate 100 as a positive direction. As shown in FIG. 13A, the angles θ of the threading dislocations in the off-substrate 100 vary. Each threading dislocation 102 in an epitaxial layer 101 is inherited in a certain direction in accordance with the impurity concentration. When a nitride concentration of the grown epitaxial layer 101 is a low concentration from about $1 \times 10^{16}$ cm$^{-3}$ to about $1 \times 10^{17}$ cm$^{-3}$, the angles θ of the threading dislocations 102 from the C-axis are within a range of 17±3 degrees. That is, the threading dislocations 102 grow in a direction of a (11-22) plane or directions within a range of ±3 degrees from the (11-22) plane. For example, the threading dislocations 102 grow in a direction parallel to a [11-23] direction or directions within a range of ±3 degrees from the [11-23] direction. When the nitride concentration of the grown epitaxial layer 101 is a high concentration greater than or equal to about $1 \times 10^{18}$ cm$^{-3}$, for example, from about $1 \times 10^{18}$ cm$^{-3}$ to about $1 \times 10^{19}$ cm$^{-3}$, the angles θ of the threading dislocations 102 from the C-axis are within a range of 24±3 degrees. That is, the threading dislocations 102 grow in a direction of a (11-23) plane or directions within a range of ±3 degrees from the (11-23) plane. For example, the threading dislocations 102 grow in a direction parallel to a [11-22] direction or directions within a range of ±3 degrees from the [11-22] direction. The inventors experimented on a directivity of a threading edge dislocation 102a when the epitaxial layer 101 is grown on the off-substrate 100 which inclines from C-plane at the predetermined off-angle. The experimental result is shown in FIG. 14A to FIG. 14D. Shadow portions in FIG. 14A and 14B and dotted patterns in FIG. 14C and 14D show bend contours that generate due to reduce thicknesses of specimens. When the impurity concentration is about $1 \times 10^{16}$ cm$^{-3}$, the threading edge location 102a in the epitaxial layer 101 grows in a direction within a range of 17±3 degrees with respect to the [0001] direction as shown in FIG. 14A and FIG. 140. When the impurity concentration is about $1 \times 10^{18}$ cm$^{-3}$, the threading edge location 102a in the epitaxial layer 101 grows in a direction within a range of 17±3 degrees with respect to the [0001] direction as shown in FIG. 14B and FIG. 14D.

A relationship between an impurity concentration and a growth direction of a threading dislocation depends on type of impurities. However, the growth direction the threading dislocation depends on an impurity concentration, and the grown direction is within a certain range at a certain impurity concentration.

In an epitaxial growth using a C-plane off-substrate, a growth direction of an inherited threading dislocation is limited to the (11-2n) plane or the (1-10n) plane. Thus, a crystal defect can be restricted based on a relationship between a direction of the epitaxial growth and a direction in which the threading dislocation is inherited.

(First Embodiment)

A method of manufacturing an SiC single crystal according to a first embodiment of the present invention will be described with reference to FIG. 1A and FIG. 1B.

First, an SIC substrate 1 is prepared as an SiC single crystal substrate. A surface of the SiC substrate 1 is a (11-22) plane. The SiC substrate 1 can be formed, for example, by growing an SiC single crystal on a C-plane off-substrate into a bulk shape and cutting the SiC single crystal on the (11-22) plane. On the surface of the SiC substrate 1, an epitaxial layer 2 made of an SiC single crystal is formed by a CVD method. As impurities in the epitaxial layer 2, for example, nitrogen can be used. An impurity concentration is set to be from about $1 \times 10^{16}$ cm$_{-3}$ to about $1 \times 10^{17}$ cm$^{-3}$.

Figure 1A:
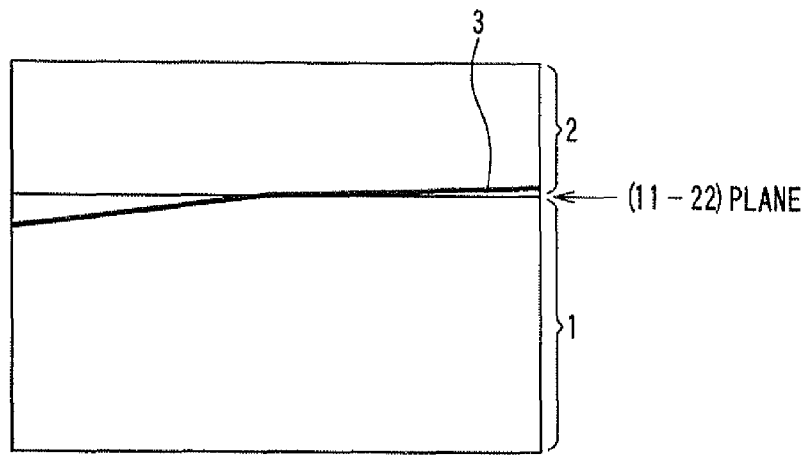
FIG. 1A and FIG. 1B are diagrams showing cross-sectional views of an SiC single crystal in processes of manufacturing the SiC single crystal by a method according to a first embodiment of the present invention.

A threading dislocation 3 included in the SiC substrate 1 grows in the epitaxial layer 2 in a direction of the (11-22) plane or directions within a range of ±3 degrees from the (11-22) plane as shown in FIG. 1A. For example, the threading dislocation 3 grows in a direction parallel to a [11-23] direction or directions within a range of ±3 degrees from the [11-23] direction. Thus, a growth direction of the threading dislocation 3 can be bent in a direction approximately perpendicular to a growth direction of the epitaxial layer 2. Thus, by growing the epitaxial layer 2, the threading dislocation 3 is discharged from a side surface of the grown epitaxial layer 2. Therefore, the threading dislocation 3 can be removed from a growth surface of the epitaxial layer 2, that is, a surface parallel to the (11-22) plane.

Figure 1B:
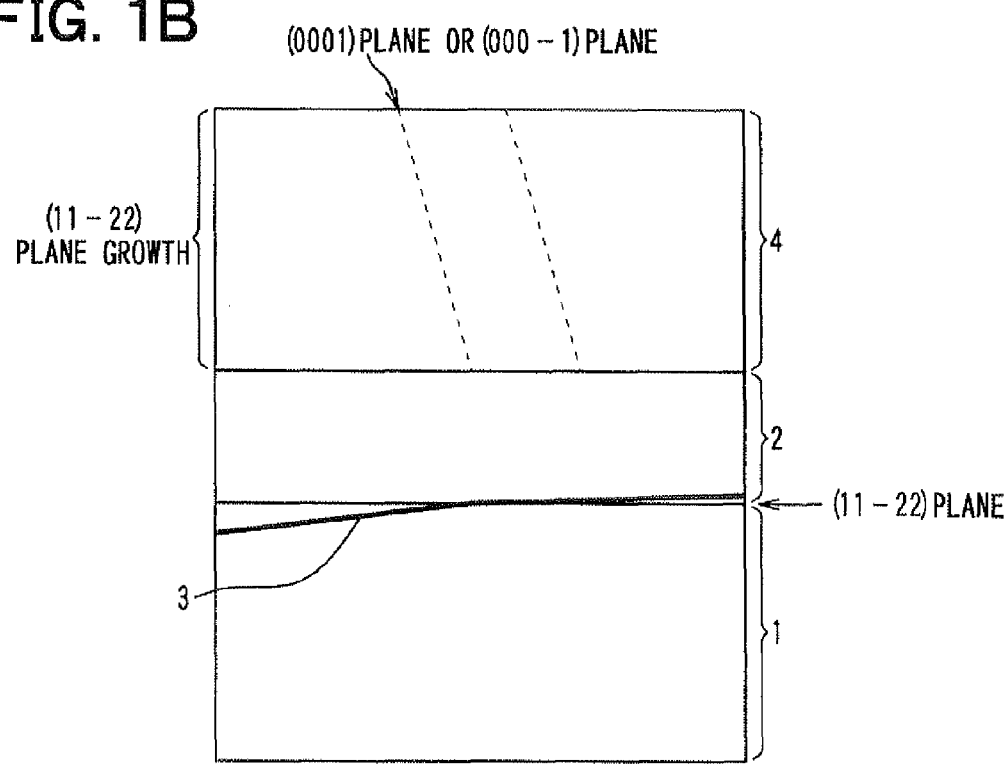

Next, as shown in FIG. 1B, an SiC single crystal 4 is bulk-grown on the surface of the epitaxial layer 2 where the threading dislocation does not exist, that is on the (11-22) plane. Because the threading dislocation 3 does not exist on the surface of the epitaxial layer 2, the SiC single crystal 4 becomes a crystal without the threading dislocation 3. Then, the SiC single crystal 4 is cut, for example, on a (0001) plane or a (000-1) plane as shown by dashed lines. The cut SiC single crystal 4 is used as a seed crystal and is off-grown by a sublimation method. Accordingly, the bulk-shaped SiC single crystal 4 having a growth plane of, for example, the (0001) plane or the (000-1) plane can be formed. By slicing the bulk-shaped SiC single crystal 4, a SiC wafer having a main surface of the (0001) plane, that is, the C-plane can be obtained.

As described above, when the epitaxial layer 2 is grown by the CVD method, the threading dislocation 3 can be discharged from the side surface of the epitaxial layer 2 using a phenomenon of limiting the growth direction of the threading dislocation 3 in accordance with the impurity concentration of the grown epitaxial layer 2, and thereby the threading dislocation 3 can almost be removed from the growth surface of the epitaxial layer 2. Then, the SiC single crystal 4 is bulk-grown by the sublimation method using the epitaxial layer 2 as a seed crystal so that a crystal defect can be restricted.

In the above-described embodiment, the epitaxial layer 2 is grown on the (11-22) plane. The epitaxial layer 2 may also be grown on other (11-2n) plane or the (1-10n) plane. That is, when the growth direction of the threading dislocation is specified based on the relationship with a type of doped impurity and an impurity concentration and the epitaxial layer 2 is grown so that the threading dislocation 3 is discharged from the side surface of the epitaxial layer 2, the epitaxial layer 2 can have the surface without the threading dislocation 3.

(Second Embodiment)

A method of manufacturing an SIC single crystal according to a second embodiment of the present invention will be described with reference to FIG. 2 to FIG. 6. As described above, in a case where the epitaxial layer 2 is grown on the (11-2n) plane or the (1-10n) plane by the CVD method, the growth direction of the threading dislocation 3 can be specified based on the relationship with the type of the doped impurity and the impurity concentration. However, in a case where the growth direction of the epitaxial layer 2 and the growth direction of the threading dislocation 3 are completely different, the growth direction of the threading dislocation 3 may deviate from an expected direction due to an influence of the growth direction of the epitaxial layer 2. Thus, in the method according to the present embodiment, the growth direction of the epitaxial layer 2 is set to be a similar direction to the growth direction of the threading dislocation 3 so that the threading dislocation 3 can grow toward a side surface of the epitaxial layer 2 and the threading dislocation 3 can be discharged from the side surface of the epitaxial layer 2 with certainty.

Figure 2:
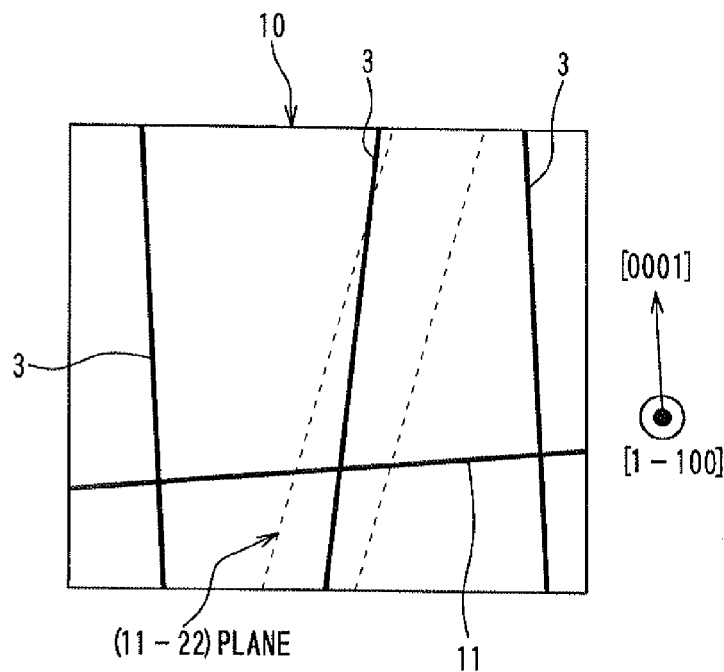
FIG. 2 is a diagram showing a side view of an SiC single crystal in a process of manufacturing the SiC single crystal by a method according to a second embodiment of the present invention.

In FIG. 2, an upper direction of the sheet is the [0001] direction, and a direction perpendicular to the sheet is the [1-000] direction.

First, as shown in FIG. 2, an SiC substrate 1 is prepared. A surface of the SiC substrate 1 is a (11-22) plane. The SiC substrate 1 can be formed by growing a bulk-shaped SiC single crystal 10 in a [0001] direction by a sublimation method and cutting the SiC single crystal 10 on the (11-22) plane. The SIC single crystal 10 includes a threading dislocation 3 growing in an angle nearly parallel to the C-axis, a base surface dislocation, and a stacking fault 11. Thus, the SIC substrate 1 includes the above-described defects.

Figure 3:
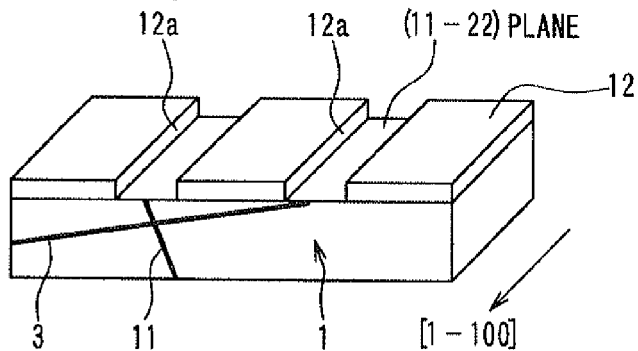
FIG. 3 is a diagram showing a perspective view of an SiC substrate in a process of manufacturing the SiC single crystal following to the process shown in FIG. 2.

Next, as shown in FIG. 3, a mask 12 is disposed on the surface of the SiC substrate 1, that is, on the (11-22) plane. The mask 12 may be made of carbon, a high melting point metal such as, for example, tantalum (Ta), molybdenum (Mo), and tungsten (W), or a carbide of the high melting point metal such as, for example, tantalum carbide (TaC). In the mask 12, a plurality of opening portions 12a having a stripe shape is provided. Each of the opening portions 12a extends in a direction perpendicular to the growth direction of the threading dislocation 3 when the epitaxial layer 2 is grown. For example, each of the opening portions 12a extends in a [1-100] direction. Intervals of the opening portions 12a are distances required for growing the epitaxial layer 2 in a horizontal direction and are determined based on a time for growing the epitaxial layer 2.

Then, the epitaxial layer 2 is formed on the surface of the SiC substrate 1 by a CVD method in a state where the surface of the SIC substrate 1 is covered with the mask 12. As impurities in the epitaxial layer 2, for example, nitride is used. The epitaxial layer 2 has an impurity concentration, for example, from about $1 \times 10^{16}$ cm$^{-3}$ to about $1 \times 10^{17}$ cm$^{-3}$.

Figure 4:
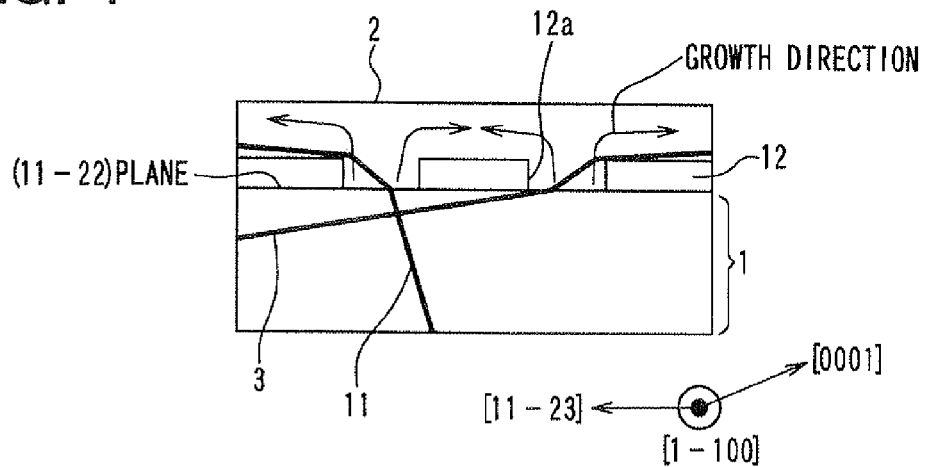
FIG. 4 is a diagram showing a cross-sectional view of the SiC single crystal in a process of manufacturing the SiC single crystal following to the process shown in FIG. 3.

Above portions of the surface of the SiC substrate covered with the mask 12, the epitaxial layer 2 grows in the horizontal direction as shown by arrows in FIG. 4. Thus, the growth direction of the epitaxial layer 2 and the growth direction of the threading dislocation 3 are controlled to be close to each other, and the threading dislocation 3 can certainly grow on the (11-22) plane or on a plane within a range of ±3 degrees from the (11-22) plane, for example, in a direction parallel to the [11-23] direction or directions within a range of ±3 degrees from the [11-23] direction. Therefore, by growing the epitaxial layer 2, the threading dislocation 3 is discharged from the side surface of the grown epitaxial layer 2, and the threading dislocation 3 is eliminated from the growth surface of the epitaxial layer 2 which is parallel to the (11-22) plane.

The base surface dislocation or the stacking fault 11 which generates in the SiC substrate 1 is changed into a threading dislocation 3 when the base surface dislocation or the stacking fault 11 is inherited in the epitaxial layer 2. Thus, the threading dislocation 3 changed from the base surface dislocation or the stacking fault 11 also grows on the (11-22) plane or on a plane within a range of ±3 degrees from the (11-22) plane, for example, in a direction parallel to the [11-23] direction or directions within a range of ±3 degrees from the [11-23] direction. Therefore, the threading dislocation 3 is discharged from the side surface of the grown epitaxial layer 2, and the threading dislocation 3 is eliminated from the growth surface of the epitaxial layer 2 which is parallel to the (11-22) plane.

Figure 5:
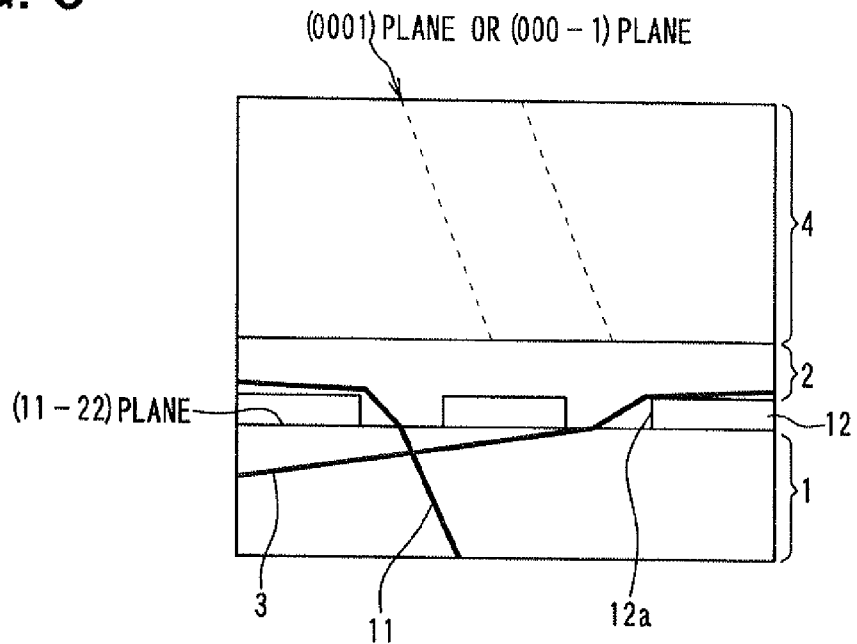
FIG. 5 is a diagram showing a cross-sectional view of the SiC single crystal in a process of manufacturing the SiC single crystal following to the process shown in FIG. 4.
Figure 6:
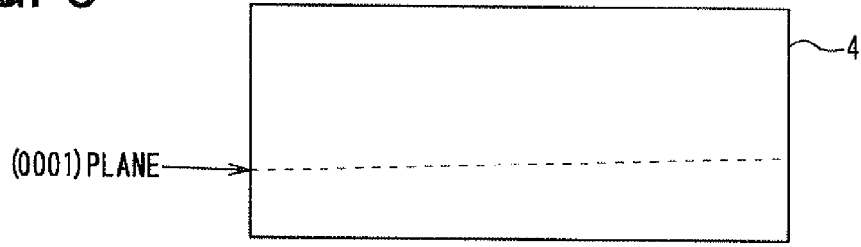
FIG. 6 is a diagram showing a cross-sectional view of the SiC single crystal in a process of manufacturing the SiC single crystal following to the process shown in FIG. 5.

Then, as shown in FIG. 5, an SiC single crystal 4 is bulk grown on the surface of the epitaxial layer 2 where the threading dislocation does not exist, that is on the (11-22) plane. Because the threading dislocation 3 does not exist on the surface of the epitaxial layer 2, the SiC single crystal 4 becomes a crystal without the threading dislocation 3. Then, the SIC single crystal 4 is cut out, for example, on a (0001) plane or a (000-1) plane as shown by dashed lines. When the cut SIC single crystal 4 is used as a seed crystal and is off-grown by a sublimation method, as shown in FIG. 6, The bulk-shaped SIC single crystal 4 having a growth plane of, for example, the (0001) plane or the (000-1) can be formed. By slicing the bulk-shaped SIC single crystal 4, a SiC wafer having a main surface of the (0001) plane, that is, the C-plane can be obtained.

As described above, when the phenomenon that the growth direction of the threading dislocation 3 can be specified in accordance with the impurity concentration of the grown epitaxial layer 2 is used, the threading dislocation 3 can be grown in the expected direction with certainty by using the mask 12 so that the growth direction of the epitaxial layer 2 and the growth direction of the threading dislocation 3 are close to each other. Thus, in the method according to the present embodiment, the effects of the first embodiment can be obtained more certainly.

When a growth thickness T of the epitaxial layer 2 is set as follows, the threading dislocation 3 can be discharged from the side surface of the epitaxial layer 2 with certainty.

Figure 7:
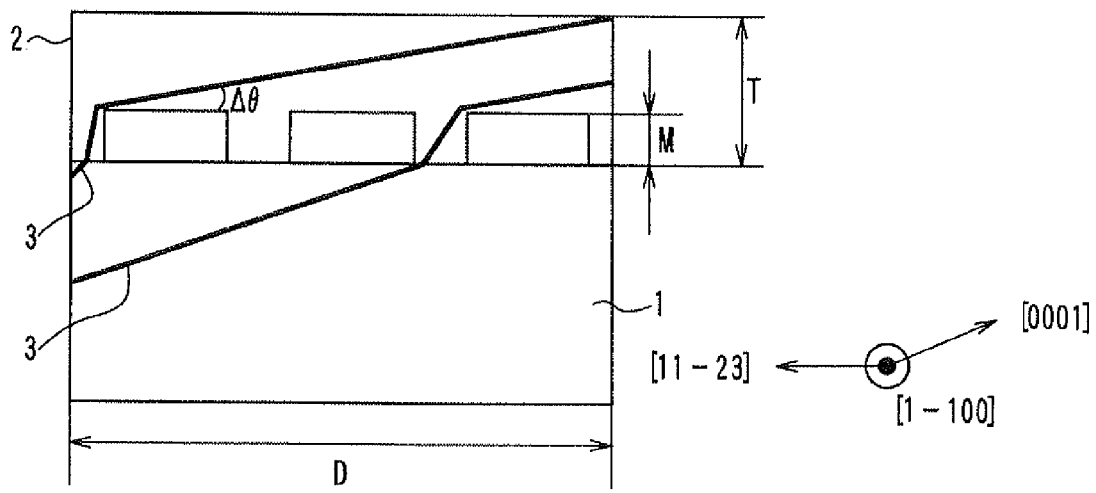
FIG. 7 is a diagram for explaining a setting of a growth thickness of an epitaxial layer.

When the SIC substrate 1 has a width (diameter) D, the mask 12 has a thickness M, and the threading dislocation 3 grows in a direction at an angle AO with respect to the (11-22) plane, as shown in FIG. 7, if the growth thickness T satisfies a relationship of T>D×tanΔθ+M, where 0 degrees≤Δθ≤3 degrees and M≥0, the threading dislocation 3 can be discharged from the side surface of the epitaxial layer 2 with certainty when a threading dislocation 3 located at one end of the SIC substrate 1 grows to an opposite end. For example, in a case where Δθ=3 degrees and M=0, when the SIC substrate 1 is a four-inch substrate, the growth thickness T of the epitaxial layer 2 is set to be greater than or equal to 5.4 millimeters, when the SIC substrate 1 is a three-inch substrate, the growth thickness T of the epitaxial layer 2 is set to be greater than or equal to 4.0 millimeters, when the SiC substrate 1 is a two-inch substrate, the growth thickness T of the epitaxial layer 2 is set to be greater than or equal to 2.7 millimeters, when the SiC substrate 1 is a one-inch substrate, the growth thickness T of the epitaxial layer 2 is set to be greater than or equal to 1.4 millimeters.

(Third Embodiment)

A method of manufacturing an SiC single crystal according to a third embodiment of the present invention will be described with reference to FIG. 8 to FIG. 11, In the method according to the present embodiment, a technique similar to the second embodiment is applied to an SiC substrate 1 having a (1-102) plane. Thus, a part different from the second embodiment will be mainly described.

In FIG, 8, an upper direction of the sheet is the [0001] direction, and a direction perpendicular to the sheet is the [11-20] direction.

Figure 8:
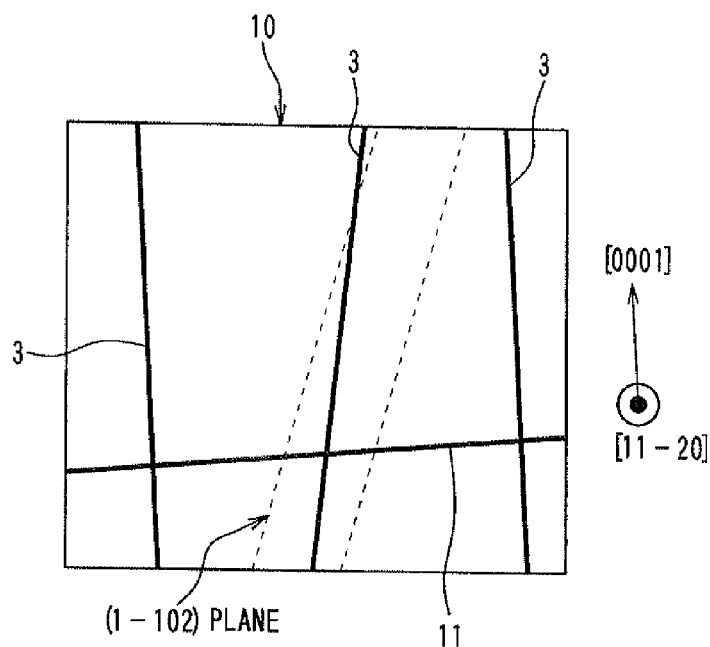
FIG. 8 is a diagram showing a side view of an SiC single crystal in a process of manufacturing the SiC single crystal by a method according to a third embodiment of the present invention.

First, as shown in FIG. 8, an SIC substrate 1 is prepared. A surface of the SiC substrate 1 is the (1-102) plane. The SiC substrate 1 can be formed by growing a bulk-shaped SiC single crystal 10 in a [0001] direction by a sublimation method and cutting the SiC single crystal 10 on the (1-102) plane. Next, a mask 12 is disposed on the surface of the SIC substrate 1, that is, the (1-102) plane of the SiC substrate 1, and a plurality of opening portions 12a having a strip shape is provided.

Figure 10:
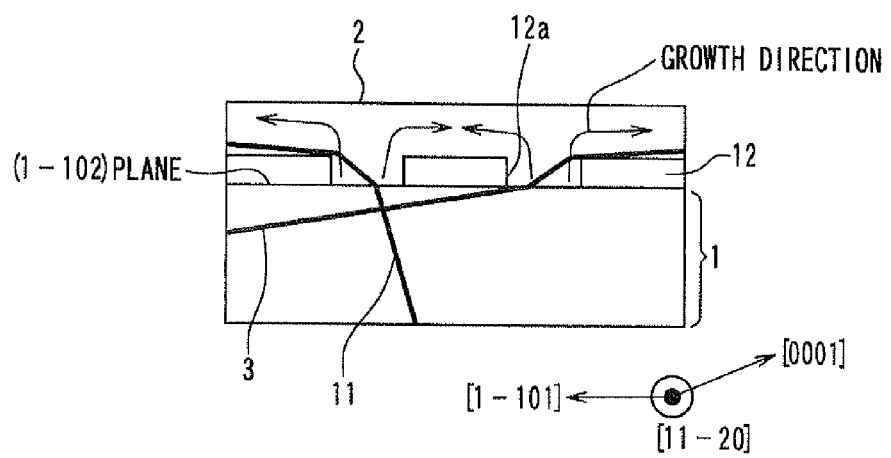
FIG. 10 is a diagram showing a cross-sectional view of the SiC single crystal in a process of manufacturing the SiC single crystal following to the process shown in FIG. 9.

Then, as shown in FIG. 10, an epitaxial layer 2 is formed on the surface of the SiC substrate 1 by a CVD method in a state where the surface of the SIC substrate 1 is covered with the mask 12. As impurities in the epitaxial layer 2, for example, nitride is used. The epitaxial layer 2 has an impurity concentration, for example, from about $1\times10^{16}$ cm$^{-3}$ to about $1\times10^{17}$ cm$^{-3}$.

Above portions of the surface of the SiC substrate covered with the mask 12, the epitaxial layer 2 grows in the horizontal direction as shown by arrows in FIG. 10. Thus, the growth direction of the epitaxial layer 2 and the growth direction of the threading dislocation 3 are controlled to be close to each other, and the threading dislocation 3 inherited from the SiC substrate 1 or the threading dislocation 3 changed from the base plane dislocation or the stacking fault 11 certainly grows on the (1-102) plane or a plane within a range of ±3 degrees from the (1-102) plane. For example, the threading dislocation 3 grows in a direction parallel to the [1-101] direction or a direction within ±3 degrees from the [1-101] direction. Therefore, by growing the epitaxial layer 2, the threading dislocation 3 is discharged from the side surface of the grown epitaxial layer 2, and the threading dislocation 3 is eliminated from the growth surface of the epitaxial layer 2 which is parallel to the (1-102) plane.

Figure 11:
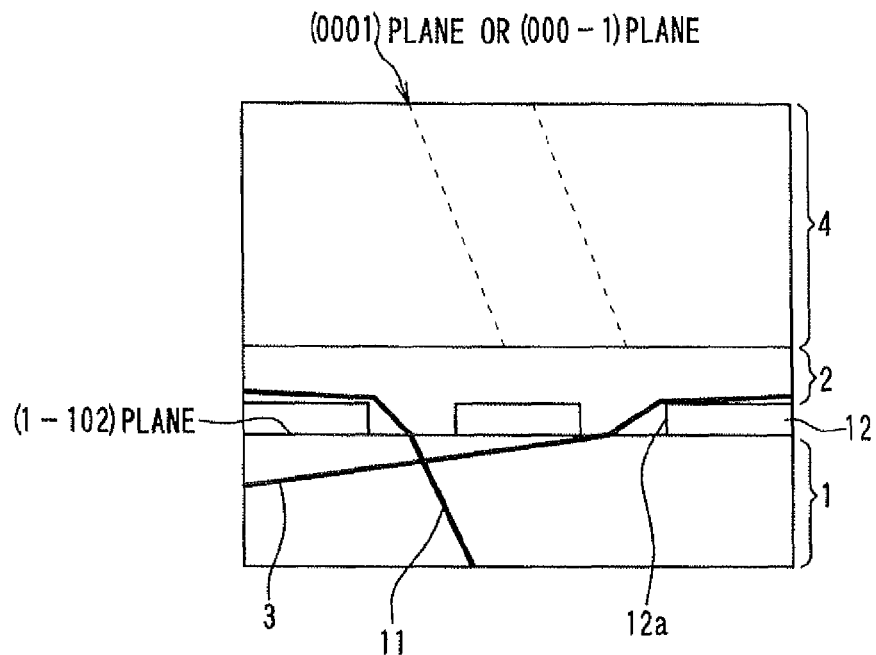
FIG. 11 is a diagram showing a cross-sectional view of the SiC single crystal in a process of manufacturing the SiC single crystal following to the process shown in FIG. 10.

Next, as shown in FIG. 11, an SIC single crystal 4 is bulk grown on the surface of the epitaxial layer 2 where the threading dislocation does not exist, that is on the (11-22) plane. Because the threading dislocation 3 does not exist on the surface of the epitaxial layer 2, the SiC single crystal 4 becomes a crystal without the threading dislocation 3. Then, the SiC single crystal 4 is cut, for example, on a (0001) plane or a (000-1) plane as shown by dashed lines. The cut SIC single crystal 4 is used as a seed crystal and is off-grown by a sublimation method. Accordingly, the bulk-shaped SiC single crystal 4 having a growth plane of, for example, the (0001) plane or the (000-1) plane can be formed. By slicing the bulk-shaped SiC single crystal 4, a SiC wafer having a main surface of the (0001) plane, that is, the C-plane can be obtained.

In the method according to the present embodiment, effects similar to those of the second embodiment can be obtained. A growth thickness of the epitaxial layer 2 according to the present embodiment can be set in a manner similar to the second embodiment.

(Fourth Embodiment)

A method of manufacturing an SiC single crystal according to a fourth embodiment of the present invention will be described below. The fourth embodiment is a combination of the second embodiment and the third embodiment.

Figure 9:
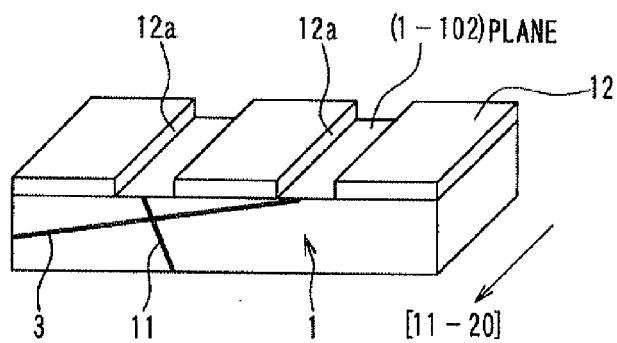
FIG. 9 is a diagram showing a perspective view of an SiC substrate in a process of manufacturing the SiC single crystal following to the process shown in FIG. 8.
Figure 12:
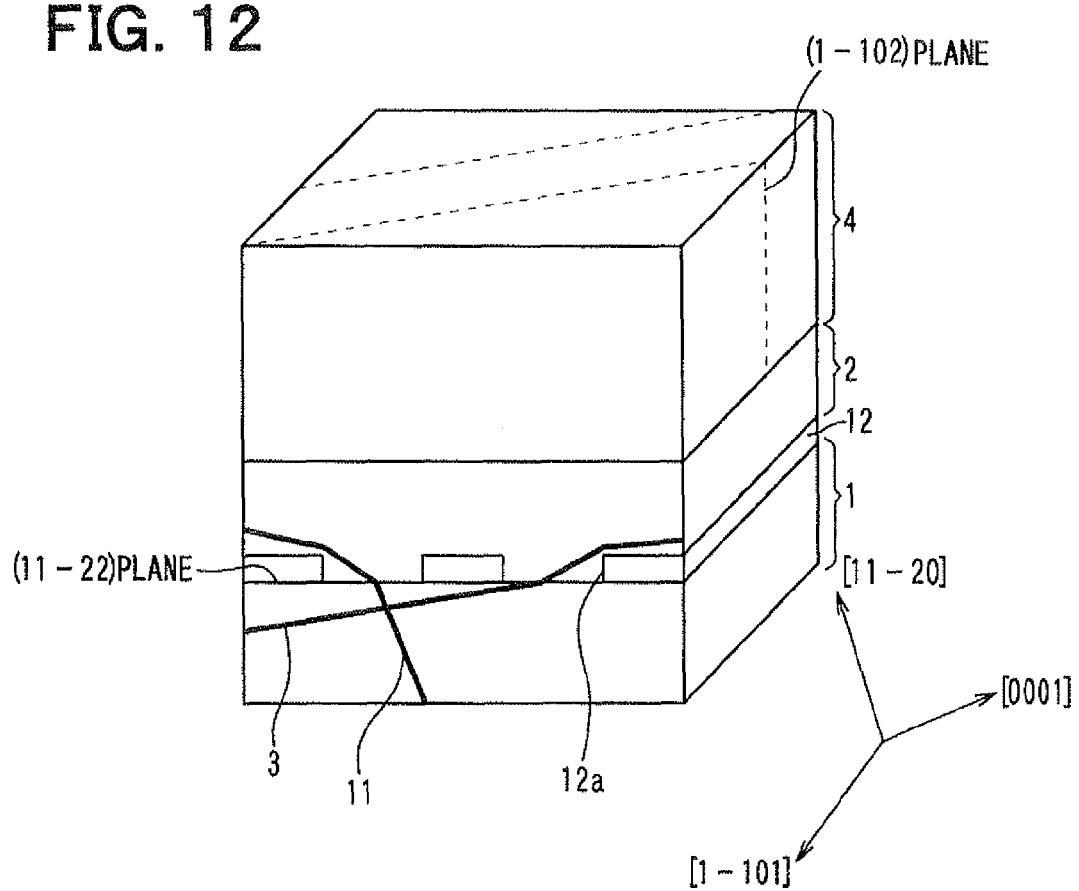
FIG. 12 is a diagram showing a perspective view of an SiC single crystal in a process of manufacturing the SiC single crystal by a method according to a fourth embodiment of the present invention.

First, the processes shown in FIG. 2 to FIG. 5 are performed, and thereby the SiC single crystal 4 which is bulk-grown on the (11-22) plane of the epitaxial layer 2 on the SiC substrate 1 is formed as shown in shown in FIG. 12. Next, as shown by dashed lines in FIG. 12, the SiC single crystal 4 is cut on the (1-102) plane. Then, the processes shown in FIG. 9 and FIG. 10 are performed.

In the method according to the present embodiment, first, the growth direction of the epitaxial layer 2 and the growth direction of the threading dislocation 3 are controlled to be close to each other in a manner similar to the second embodiment, and the threading dislocation 3 is grown on the (11-22) plane or a plane within ±3 degrees from the (11-22) plane. Even when the threading dislocation 3 remains, the growth direction of the epitaxial layer 2 and the growth direction of the threading dislocation 3 are controlled to be close to each other in a manner similar to the third embodiment, and the threading dislocation 3 is grown on the (1-102) plane or a plane within ±3 degrees from the (1-102) plane.

Thus, the threading dislocation 3 can be discharged from the side surface of the epitaxial layer 2 more certainly, and the effects of the first embodiment can be obtained more certainly.

(Other Embodiments)

Although the present invention has been fully described in connection with the exemplary embodiments thereof with reference to the accompanying drawings, it is to be noted that various changes and modifications will become apparent to those skilled in the art.

In the above-described embodiments, as examples of the (11-2n) plane and the (1-10n) plane, the (11-22) plane and the (1-102) plane are used and the threading dislocation 3 is grown along the (11-22) plane or the (1-102) plane. The above-described methods can be applied even when the threading dislocation 3 grows along other plane in the (11-2n) plane and the (1-10n) plane. For example, when a (11-21) plane is used, the threading dislocation 3 may be grown, for example, in a [11-26] direction. When an SiC substrate having a surface of a (11-23) plane is used, an impurity concentration of the epitaxial layer 2 may be set to be greater than or equal to about $1\times10^{18}$ cm$^{-3}$ so that a threading dislocation 3 can grow in a direction of the (11-23) plane or directions within a range of ±3 degrees from the (11-23) plane, as shown in FIG. 13A, FIG. 14B, and FIG. 14D.

When an orientation of a crystal face is described, it is originally required for attaching a bar above a desired figure. However, the bar is attached before the figure in the present application.

What is claimed is

1. A method of manufacturing a silicon carbide single crystal, comprising:
    preparing a silicon carbide substrate having a surface of one of a (11-2n) plane and a (1-10n) plane, where n is any integer number greater than or equal to 0, the silicon carbide substrate having threading dislocations whose angles with respect to a C-axis vary;
    growing an epitaxial layer having a predetermined impurity concentration on the one of the (11-2n) plane and the (1-10n) plane of the silicon carbide substrate by a chemical vapor deposition method and growing the threading dislocations approximately parallel to the one of the (11-2k) plane and the (1-10k) plane, where k is any integer number greater than or equal to 2, and discharging the threading dislocations from a side surface of the epitaxial layer; and
    growing a silicon carbide single crystal into a bulk shape by a sublimation method on the one of the (11-2n) plane and the (1-10n) plane of the epitaxial layer from which the threading dislocations were discharged.

2. The method according to claim 1, further comprising:
    disposing a mask having an opening portion on the one of the (11-2n) plane and the (1-10n) plane of the silicon carbide substrate, wherein
    the growing the epitaxian layer is performed in a state where a part of the one of the (11-2n) plane and the (1-10n) plane is covered with the mask.

3. The method according to claim 2, wherein
    the surface of the silicon carbide substrate is the (11-2n) plane, and
    the opening portion has a stripe shape extending in a [1-100] direction.

4. The method according to claim 2, wherein
    the surface of the silicon carbide substrate is the (1-10n) plane, and
    the opening portion has a stripe shape extending in a [11-20] direction.

5. The method according to claim 2, wherein
    when the epitaxial layer has a growth thickness T, the mask has a thickness M, the threading dislocation grows in the epitaxial layer in a direction at an angle $\Delta\theta$ with respect to the one of the (11-2n) plane and the (1-10n) plane of the silicon carbide substrate, and the silicon carbide substrate has a width D in a direction along the direction in which the threading dislocation grows, the growing the epitaxial layer is performed so that the growth thickness T satisfies a relationship of $T>D\times\tan\Delta\theta+M$, where 0 degrees $\leq\Delta\theta\leq$3degrees and $M\geq0$.

6. The method according to claim 1, wherein
    the surface of the silicon carbide substrate is a (11-22) plane, and
    the predetermined impurity concentration of the epitaxial layer is from about $1\times10^{16}$ cm$^{-3}$ to about $1\times10^{17}$ cm$^{-3}$.

7. The method according to claim 1, wherein
    the surface of the silicon carbide substrate is a (11-23) plane, and
    the predetermined impurity concentration of the epitaxial layer is greater than or equal to about $1\times10^{18}$ cm$^{-3}$.

8. The method according to claim 1, further comprising:
    cutting the silicon carbide single crystal on one of a (0001) plane and a (000-1) plane so as to a seed crystal having a surface of the one of the (0001) plane and the (000-1) plane; and
    growing a silicon carbide single crystal on the one of the (0001) plane and the (000-1) plane of the seed crystal into a bulk shape by a sublimation method.

9. A method of manufacturing a silicon carbide single crystal, comprising:
    preparing a silicon carbide substrate having a surface in a plane selected from the group consisting of a (11-2n) plane and a (1-10n) plane, where n is an integer greater than or equal to 0,the silicon carbide substrate having threading dislocations whose angles with respect to a C-axis vary;
    growing an epitaxial layer having a predetermined impurity concentration on the surface of the selected plane of the silicon carbide substrate by a. chemical vapor deposition method, causing a threading dislocation to grow approximately parallel to the selected plane and discharging the threading dislocation from a side surface of the epitaxial layer; and
    growing a silicon carbide single crystal into a bulk shape by a sublimation method on the selected plane of the epitaxial layer from which the threading dislocation was discharged.

10. The method according to claim 9, further comprising:
    disposing a mask having an opening portion on the selected plane of the silicon carbide substrate, wherein
    the growing of the epitaxial layer being performed in a state where a part of the selected plane is covered with the mask.

11. The method according to claim 10, wherein
    the selected plane of the silicon carbide substrate is the (11-2n) plane, and
    the opening portion includes a slit extending in a [1-100] direction.

12. The method according to claim 10, wherein
    the selected plane of the silicon carbide substrate is the (1-10n) plane, and
    the opening portion includes a slit extending in a [11-20] direction.

13. The method according to claim 10, wherein
    when the epitaxial layer has a growth thickness T, the mask has a thickness M, the threading dislocation grows in the epitaxial layer in a direction at an angle $\Delta\theta$ with respect to the selected plane, and the silicon carbide substrate has a width D in a direction along the direction in which the threading dislocation grows, the growing the epitaxial layer is performed so that the growth thickness T satisfies a relationship of $T>D\times\tan\Delta\theta+M$, where 0 degrees $\leq\Delta\theta\leq$3degrees and $M\geq0$.

14. The method according to claim 10, wherein
    the selected plane of the silicon carbide substrate is a (11-22) plane, and
    the predetermined impurity concentration of the epitaxial layer is from about $1\times10^{16}$ cm$^{-3}$ to about $1\times10^{17}$ cm$^{-3}$.

15. The method according to claim 10, wherein
    the selected plane of the silicon carbide substrate is a (11-23) plane, and
    the predetermined impurity concentration of the epitaxial layer is greater than or equal to about $1\times10^{18}$cm$^{-3}$.

16. The method according to claim 10, further comprising:
selecting a plane of the silicon carbide substrate from the group consisting of a (0001) plane and a (000-1) plane;
cutting the silicon carbide single crystal on the selected plane; and
growing a silicon carbide single crystal on the selected plane of the seed crystal into a bulk shape by a sublimation method.

\* \* \* \* \*